United States Patent [19]

Honda et al.

[11] Patent Number: 5,479,085
[45] Date of Patent: Dec. 26, 1995

[54] METHOD AND APPARATUS FOR MEASURING RESIDUAL CAPACITY OF AN ELECTRIC-VEHICLE BATTERY

[75] Inventors: Satoshi Honda; Yoshihiro Nazazawa, both of Saitama, Japan

[73] Assignee: Honda Giken Kogyo Kabushiki Kaisha, Japan

[21] Appl. No.: 157,328

[22] Filed: Nov. 26, 1993

[30] Foreign Application Priority Data

Nov. 27, 1992 [JP] Japan .................................. 4-319069

[51] Int. Cl.⁶ ...................... G01R 31/30; H01M 10/48
[52] U.S. Cl. .................. 320/48; 320/43; 429/92; 324/425
[58] Field of Search .................... 320/43, 44, 48; 429/90, 92, 93; 324/425, 435, 420

[56] References Cited

U.S. PATENT DOCUMENTS

| | | | |
|---|---|---|---|
| 4,258,306 | 3/1981 | Bourke et al. | 320/48 |
| 4,390,841 | 6/1983 | Martin et al. | 324/427 |
| 4,560,937 | 12/1985 | Finger | 324/433 |
| 5,047,961 | 9/1991 | Simonsen | 364/550 |
| 5,218,288 | 6/1993 | Mackal et al. | 320/48 |
| 5,325,041 | 6/1994 | Briggs | 320/44 |
| 5,394,089 | 2/1995 | Clegg | 324/427 |

FOREIGN PATENT DOCUMENTS

| | | |
|---|---|---|
| 0505333 | 9/1992 | European Pat. Off. . |
| 502130 | 1/1975 | Japan . |
| 3135302 | 10/1991 | Japan . |
| 2080550 | 2/1982 | United Kingdom . |
| 2116728 | 9/1983 | United Kingdom . |

Primary Examiner—Peter S. Wong
Assistant Examiner—Robert Nappi

[57] ABSTRACT

A method and an apparatus are provided for detecting a current residual capacity of a battery employed in an electric vehicle, such as an electric car. During a charging process, a value of the charge current of the battery is measured and an estimated discharge voltage corresponding to a current battery accumulated power is determined. A power of the battery as a product of the value of the charge current of the battery and the estimated discharge voltage is thereafter computed and the computed power is added to the current battery accumulated power to provide a new current battery accumulated power for display. During a discharging process, values of the discharge voltage and the discharge current are measured. The amount of consumed power is thereafter computed as a product of the values of the discharge voltage and the discharge current. The computed amount of consumed power is subtracted from a current battery residual capacity to produce a new current battery residual capacity for display. The above estimated discharge voltage is found from data obtained from test-working experiments or a process of learning the running states of an actual electric vehicle.

6 Claims, 7 Drawing Sheets

Fig.4 BATTERY VOLTAGE / TIME

Fig.5 DISCHARGE CURRENT / TIME

Fig.6 ESTIMATED DISCHARGE VOLTAGE (V) / BATTERY RESIDUAL CAPACITY (%)

METHOD AND APPARATUS FOR MEASURING RESIDUAL CAPACITY OF AN ELECTRIC-VEHICLE BATTERY

BACKGROUND OF THE INVENTION

1. Field of the Invention

The present invention relates to a method and an apparatus for accurately measuring residual capacity of a battery employed in an electric vehicle, or more specifically an electric car.

2. Description of the Background Art

So far, a variety of meters, apparatuses and the like for measuring residual electric charge of a dischargeable battery have been proposed. Residual electric charge of a battery is also referred to hereafter simply as battery residual capacity. An example of such equipment is disclosed in Japanese Patent Laid-open No. S50-2130. In addition, addressing environmental problems arising in recent years, there have been rising demands for migration to and development of an electric car as a substitute for the conventional gasoline-powered car. As a result, a residual capacity meter becomes indispensable for accurately measuring the residual electric charge of a battery used in such an electric car.

Figure 8:
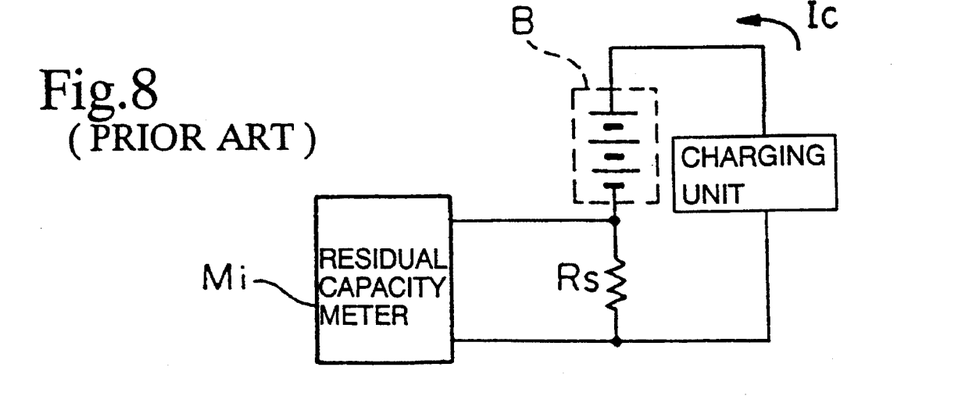
FIG. 8 illustrates a simplified circuit of a meter adopting a conventional battery current integration technique for measuring the amount of electric charge accumulated in a battery during a charging process.
Figure 9:
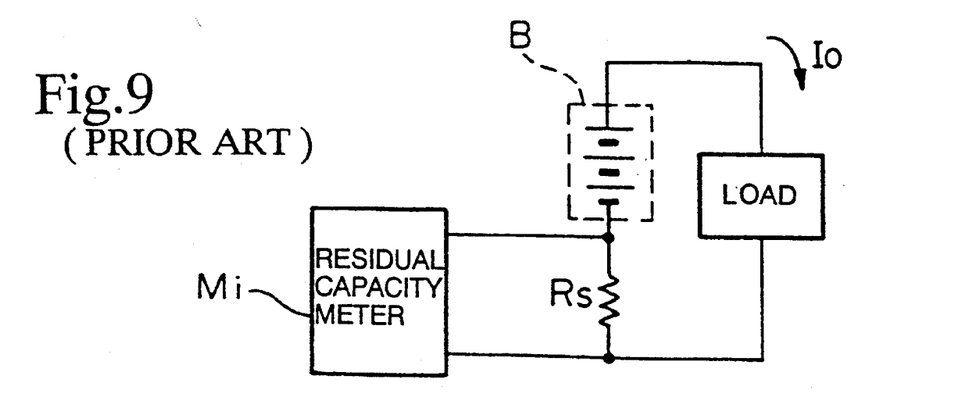
FIG. 9 illustrates a simplified circuit of a meter adopting a conventional battery current integration technique for measuring the amount of residual electric charge in a battery during a discharging process.

FIGS. 8 and 9 each show a simplified diagram of an electrical circuit of a meter for measuring battery residual capacity, strictly speaking, for measuring residual electric charge of a battery using a conventional technique known as the battery current integration method.

The flow of current in a process of electrically charging a battery B is shown in FIG. 8. As shown in the figure, a charging current Ic flowing out from an 10 electrical charging unit flows into the battery B. At the same time, the current Ic also flows through a shunt resistor Rs connected in series to the battery B. The shunt resistor Rs allows a residual capacity meter Mi to measure the charge current Ic. Measured values are integrated gradually over the lapse of time to determine the amount of electric charge stored in the battery B. As the battery B enters a fully charged state, the residual capacity meter Mi displays the result of the integration representing the full-charge value as an initial battery residual capacity or, strictly speaking, the amount of electric charge stored initially in the battery B.

On the other hand, FIG. 9 shows a discharge current or a consumed current Io flowing out off the battery B. As shown in the figure, the discharge current Io flows through the shunt resistor Rs and a load. Likewise, the shunt resistor Rs allows the residual capacity meter Mi to measure the discharge current Io as is the case with the charge current Ic. In the case of the discharge current Io, however, measured values are subtracted gradually over the lapse of time from the initial battery residual capacity. A result of the subtraction at a particular time is displayed as a battery residual capacity at that time or, strictly speaking, the amount of residual electric charge currently left in the battery B.

With the above technique, the value of the battery residual capacity expressed in terms of electric charge units called ampere-hours (Ah) can be measured with a relatively high degree of accuracy. In general, however, a battery has a characteristic which shows a variable terminal voltage. The terminal voltage changes depending upon, among other factors, varying conditions due to discharge current consumed by a load and residual electrical charge left in the battery at the time the load is connected. Therefore, the amount of residual capacity measured by the technique described above cannot necessarily be said to represent the residual electric charge actually remaining in the battery. In addition, in the case of an electric car, the travelable distance is proportional to the amount of energy that can be consumed from a battery employed therein. In other words, the distance that can be traveled by the electric car is proportional to the amount of residual capacity in the battery expressed in terms of watt-hours (Wh), an energy unit, instead of ampere-hours (Ah), the electric-charge unit cited above. Therefore, the technique for measuring a battery residual capacity described above is not appropriate for measuring a residual energy in the battery of an electric car indicative of a distance travelable by the electric car.

Figure 10:
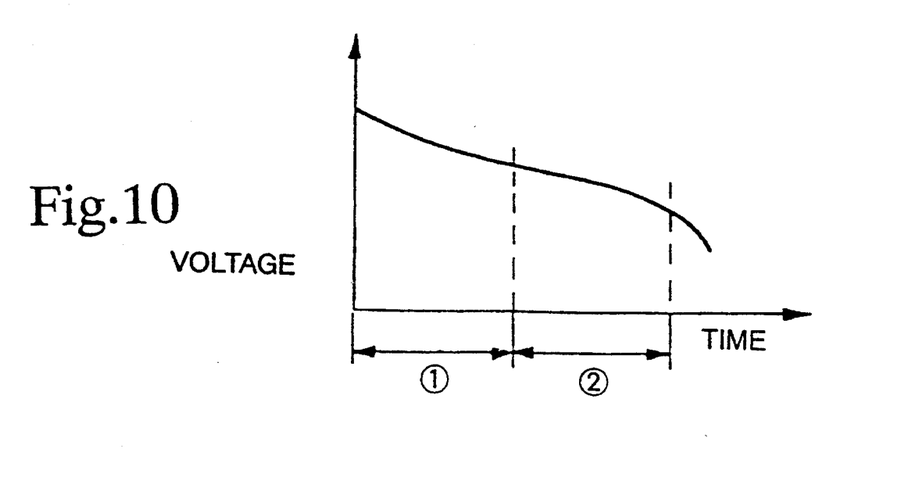
FIG. 10 illustrates a curve representing a typical discharge characteristic of a battery.
Figure 11:
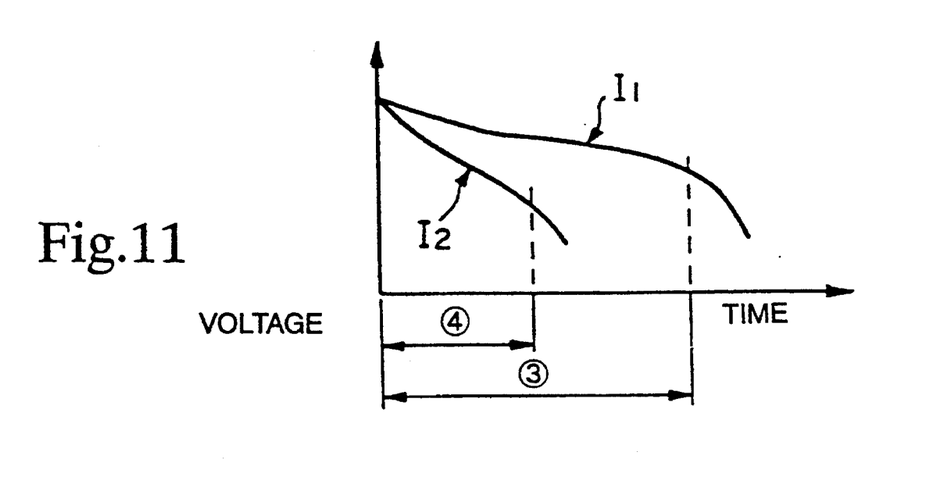
FIG. 11 illustrates curves representing typical discharge characteristics of a battery.

The reason why the above technique is not suitable for an electric car is explained by referring to FIGS. 10 and 11. These figures each show a discharge characteristic of a battery. FIG. 10 shows the case of a fixed discharge current in which the voltage thus decreases gradually with the lapse of time. The figure shows two equal periods of time (1) and (2). Since the discharge current is constant, electric charges discharged from the battery expressed in terms of ampere-hours (Ah) are the same during both the periods of time (1) and (2,). As shown in FIG. 10, however, the terminal voltage of the battery during the period of time (1) is different from that during the period (2). Accordingly, the energy consumed from the battery expressed in terms of watt-hours (Wh) during the period of time (1) is greater than that in the period (2) due to the fact that the terminal voltage in the former period (1) is higher than that in the latter period (2).

On the other hand, FIG. 11 shows two types of discharge current curves which correspond to discharge currents I1 and I2. Let the magnitudes of the two discharge currents be related by an equation I2=I1*2. Also, assume that a period of time (3) is twice as long as a period of time (4) in length. The Ah value consumed through the discharge current I1 during the period (3) is therefore equal to the Ah value consumed through the current I2 during the period (4). As shown in FIG. 11 however, the terminal voltage of the battery for the discharge current I1, is higher than that for the discharge current I2. Accordingly, the energy consumed from the battery expressed in terms of watt-hours (Wh) through the discharge current I1, is much greater than that consumed through the discharge current I2 due to the fact that the terminal voltage during and the length of the period (3) are greater than the terminal voltage during and the length of the period (4). In other words, with the conventional current integration technique, the discharge currents I1 and I2 result in the same amounts of battery residual charges expressed in terms of ampere-hours. However, the amounts of residual energies expressed in terms of watt-hours actually left in the battery are different. Accordingly, the conventional current integration technique is not suitable for measuring and displaying the amount of energy consumed by a traveling electric car or the amount of residual energy remaining in the battery.

Figure 12:
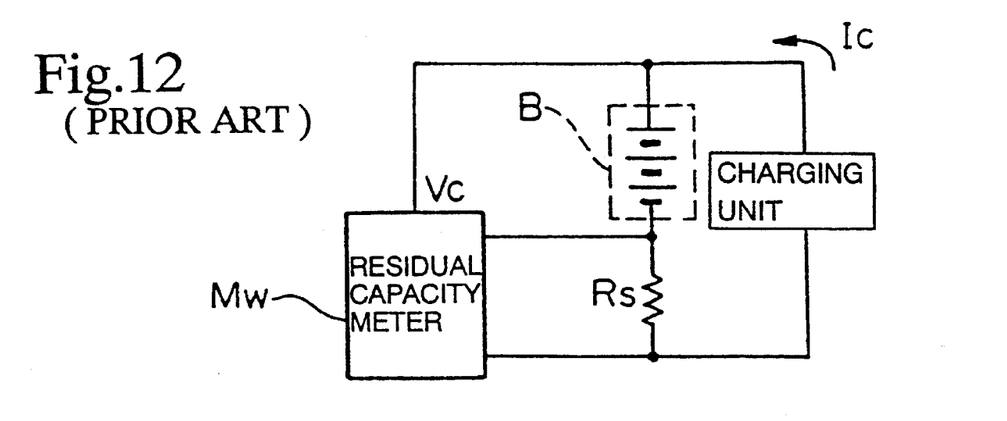
FIG. 12 illustrates a simplified circuit of a meter adopting a conventional battery power integration technique for measuring the amount of electric energy accumulated in a battery during a charging process.
Figure 13:
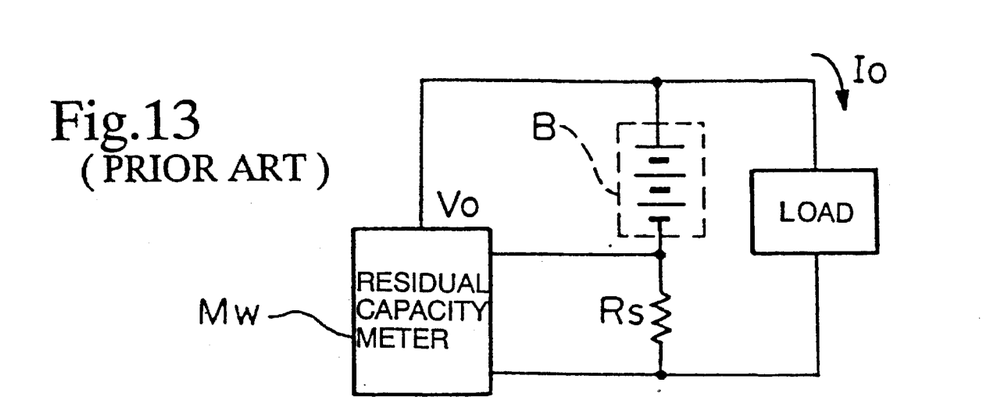
FIG. 13 illustrates a simplified circuit of a meter adopting a conventional battery power integration technique for measuring the amount of residual electric energy in a battery during a discharging process.

In order to solve the problem described above, a conventional meter Mw for measuring a battery residual capacity shown in FIGS. 12 and 13 is used. The meter Mw adopts a battery power integrating technique. In addition to measuring a current as in the configuration described above, this instrument Mw also measures the terminal voltage of a battery B. To be more specific, during a process of charging the battery B shown in FIG. 12, the residual capacity meter Mw measures a charge current Ic flowing through a shunt resistor Rs as well as a charge voltage Vc of the battery B. The amount of power is then calculated as a product of measured values of the charge current Ic and the charge voltage Vc obtained in this way. Likewise, the calculated power is gradually integrated over the lapse of time. As the battery B enters a fully charged state, the residual capacity meter Mw displays the result of the integration representing the full charge capacity as an initial battery residual capacity. Strictly speaking, the result of integration represents a full charge energy initially stored in the battery B since power is integrated along the time axis.

On the other hand, FIG. 13 shows a discharge current or a consumed current Io flowing out off the battery B. As shown in the figure, the discharge current Io flows through the shunt resistor Rs and a load. Likewise, the residual capacity meter Mw measures the discharge current Io and a discharge voltage Vo to calculate consumed power as is the case with the measurement shown in FIG. 12. In the case of consumed power, however, measured values are subtracted gradually over the lapse of time from the initial battery-residual capacity. A result of the subtraction at a particular time is displayed as a battery residual power at that time or, strictly speaking, a residual energy left in the battery at that time.

In general, an electric car is driven with its battery exhausted after traveling along a fixed distance. Accordingly, the battery is most likely used in a constant-watt discharge mode. With the power integration technique described above, the amount of energy consumed by a traveling electric car or the amount of residual energy is displayed in terms of watt-hours. Therefore, the technique is appropriate for determining the remaining distance along which an electric car can travel.

Figure 14:
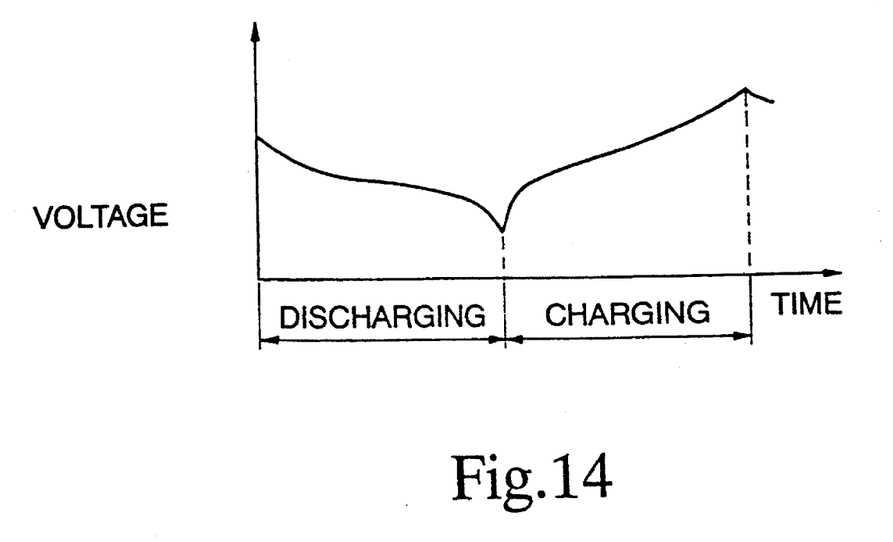
FIG. 14 illustrates curves representing typical discharge and charge characteristics of a battery.

Nevertheless, the power integration technique described above is effective only if the charge voltage of the battery is equal in magnitude to the discharge voltage thereof. If they are different, a problem will arise. This problem is explained by referring to FIG. 14. Assume that the battery is discharged by a fixed current flow and then, later on, charged with the same current as the discharge current. As shown in the figure, however, the discharge voltage generally tends to be lower than the charge voltage. The difference in voltage is caused by, among other things, a difference in chemical potential between the chemical reactions during charging and discharging processes. The causes of the difference in voltage may also include the effect of an internal resistance of the battery. Thus, a battery residual capacity in terms of Wh cannot be obtained by calculation using an integration result in Wh obtained in the charging process as it is. This is because the Wh integration result obtained in the charging process is calculated with respect to a charge voltage which is higher than the discharge voltage. The result expressed in terms of Wh thus includes a portion that cannot be consumed as an energy required by the electric car to travel. As a result, it becomes difficult to directly apply the power integration technique described above to the calculation of a battery residual capacity even though the technique is regarded as appropriate.

SUMMARY OF THE INVENTION

The present invention addresses the above problems, providing a technique and an apparatus for measuring a battery residual capacity that can accurately provide information indicative of a distance travelable by an electric vehicle or car.

In order to achieve the object described above, the present invention provides a method of measuring a residual capacity of a battery used in an electric car wherein, during a charging process, the battery residual capacity is measured by repeatedly carrying out the steps of measuring a charge current of the battery; finding an estimated discharge voltage corresponding to a most recent battery residual capacity; calculating a product of the charge current and the estimated discharge voltage; and integrating the product into the most recent battery residual capacity to provide a new most recent battery residual.

During a discharging process, the battery residual capacity is measured by repeatedly performing the steps of measuring a discharge current and a discharge voltage; calculating a product of the discharge current and the discharge voltage; and subtracting the product from a most recent battery residual capacity to give a new most recent battery residual capacity.

The present invention also provides a method whereby a state in which a battery is fully charged is detected and a most recent battery residual capacity in the state is taken as an initial battery residual capacity.

The present invention further provides a method whereby data indicating a correlation between average values of the discharge voltage and values of the residual capacity of a battery measured in a variety of test-working experiments of an electric car is stored in advance and the stored data is used for finding an estimated value of the discharge voltage of an actually running electric car which corresponds to the current battery residual capacity.

The present invention also provides another method whereby data indicating a correlation between average values of the discharge voltage and values of the residual capacity of a battery measured in an electric car in an actually running state is gradually stored in a learning process and the data stored in the learning process is used for finding the estimated value of the discharge voltage of the electric car in an actually running state which corresponds to the current battery residual capacity.

In addition, the present invention provides an apparatus for measuring a residual capacity of a battery used in an electric car which comprises a voltage detector for measuring a terminal voltage of the battery; a current detector for measuring a charge current during a charging process and a discharge current during a discharging process of the battery; and a determination unit for finding an estimated discharge voltage corresponding to a current residual capacity of the battery. During the discharging process, a consumed power computed from a measured value of the terminal voltage and a measured value of the discharge current is subtracted gradually from a most recent battery residual capacity to provide a new most recent battery residual capacity. During the charging process, a stored power computed from a value of the estimated discharge voltage and a measured value of the charge current is added accumulatively to a most recent accumulated energy to give a new most recent accumulated energy.

The present invention also provides an apparatus for measuring a residual capacity of a battery used in an electric car wherein a determination unit for finding an estimated discharge voltage corresponding to a current battery residual capacity stores data indicating a correlation between average values of the discharge voltage and values of the residual capacity of a battery measured in advance and uses the stored data for finding the estimated value of the discharge voltage of an actually running electric car which corresponds to the current battery residual capacity.

According to the present invention, during a discharging process, the terminal voltage and the discharge current of a battery are each measured and a consumed power is then computed as a product of measured values of the terminal voltage and the discharge current. Subsequently, the consumed power is subtracted from a current battery residual capacity to provide a most recent battery residual capacity for display. During a charging process, on the other hand, an estimated discharge voltage for the current battery residual capacity is found and the charge current of a battery is measured. Then, an input power is computed as a product of the estimated discharge voltage and a measured value of the charge current. Subsequently, the input power is accumulatively added to the current battery residual capacity to provide a new current battery residual capacity for display.

The battery residual capacity indicates a distance travelable by the electric car. Also, while the battery is being discharged, estimated discharge voltages are found as a function of battery residual capacity from measured values of the discharge current and voltage which are obtained experimentally or in a learning process. The estimated discharge voltages are, on the other hand, used for calculating battery residual capacities during a charging process. The method provided by the present invention thus allows the battery residual capacity representing a distance travelable by an electric car to be measured with a higher degree of accuracy than the conventional technique.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DESCRIPTION OF THE PREFERRED EMBODIMENTS

Figure 1:
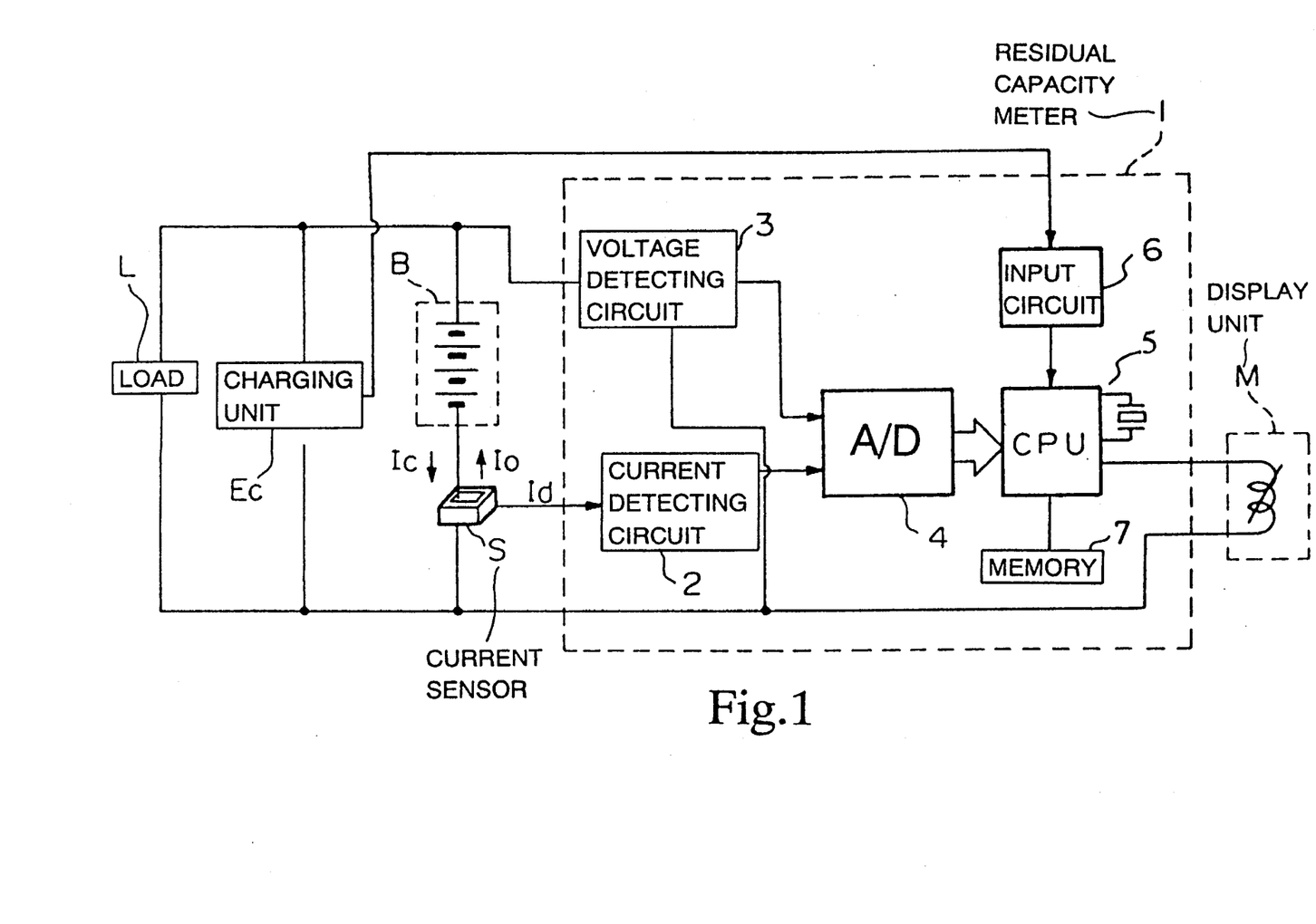
FIG. 1 is a block diagram of the electrical configuration of an embodiment implementing an apparatus for measuring a residual capacity of a battery employed in an electrical car in accordance with the present invention.

FIG. 1 is a block diagram showing the electrical configuration of an embodiment implementing an apparatus for measuring a battery residual capacity in accordance with the present invention. As shown in FIG. 1, a load L, a charging unit Ec, a battery B and a residual capacity meter 1 are connected to each other in parallel. A charge current Ic and a discharge current Io are sensed by a non-contact current sensor S which is connected in series with the battery B. The current sensor S outputs a detection signal Id to the residual capacity meter 1. The residual capacity meter 1 is equipped with an external display unit M for displaying the battery residual capacity as a result of computation produced by the residual capacity meter 1. Internally, the residual capacity meter 1 comprises a current detecting circuit 2, a voltage detecting circuit 3, an analog-to-digital converter (A/D converter) 4, a central processing Unit (CPU) 5, an input circuit 6 and a storage memory 7 such as a ROM or RAM. The CPU 5 further includes an arithmetic-logic unit (ALU) and an input/output (I/O) unit which are not shown in FIG. 1. In a typical application, the CPU 5 and the A/D converter 4 may be integrated in a single chip.

In the configuration described above, the detection current Id output by the current sensor S is detected by the current detecting circuit 2 and converted into an analog signal representing the magnitude of the detection signal Id. The analog signal is then output to the A/D converter 4. On the other hand, the voltage detecting circuit 3 measures the terminal voltage of the battery B. The measured value of the terminal voltage is also output to the A/D converter 4 as an analog signal. The A/D converter 4 converts these analog signals into respective digital data which are then supplied to the CPU 5. The digital data of the current and voltage is used by the CPU 5 for computing values of power as products thereof.

During a charging process, the values of the power computed as products of the current and voltage are summed up. Strictly speaking, however, the values of the power are computed from the digital data of the current Id and estimated values of the discharge voltage instead of the measured values of the terminal voltage of the battery B. When the battery B enters a fully charged state during a charging process, the charging unit Ec detects this state, outputting a full charge signal which is also supplied to the CPU 5 through the input circuit 6. Upon receiving the full charge signal, the CPU 5 terminates the calculation and the summing of the values of the power. The final result is stored as a full charge value in a location provided in advance in the memory 7 and is also output to the display unit M as well.

During a discharging process, on the other hand, the CPU 5 computes a value of the consumed power from data representing the discharge current Io sensed by the current sensor S and data representing the measured terminal voltage of the battery B. The computed value is subtracted from the full charge value described above to provide a current battery residual capacity which is output to the display unit M. This processing is repeated to update the value and the display of the battery residual capacity.

The arithmetic processings and operations carried out by the CPU 5 during the charging and discharging processes are hereinafter described in detail by referring to flowcharts shown in FIGS. 2 and 3.

Figure 2:
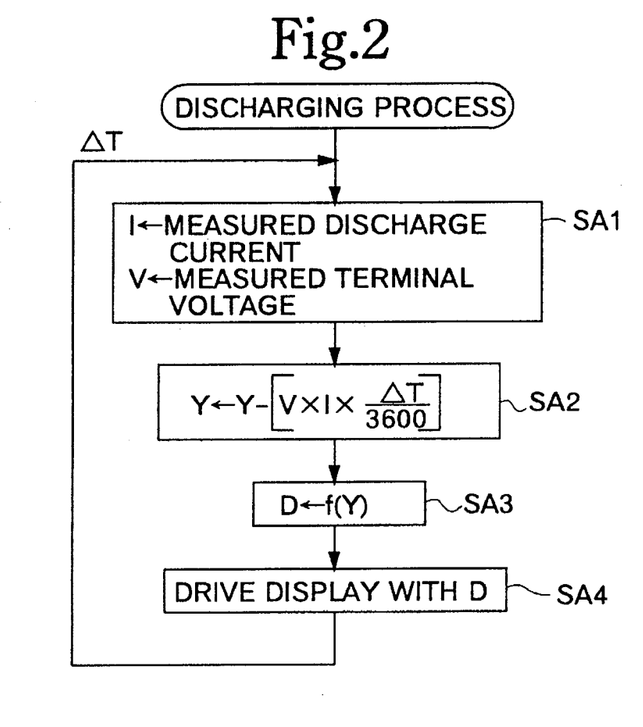
FIG. 2 illustrates a flowchart of a procedure to be followed by a CPU for carrying out arithmetic processings and operations during a discharging process.

FIG. 2 illustrates a flowchart of arithmetic processings and operations carried out by the CPU 5 during a discharging process. As shown in FIG. 2, the flowchart comprises processing steps SA1 to SA4 which are executed repeatedly every $\Delta T$ seconds, which represents a predetermined residual capacity calculation cycle. Let Io be the discharge current flowing through the load L connected to the battery B. Data I representing a measured value of the discharge current Io and data V representing a measured value of the terminal voltage of the battery B are supplied to the CPU 5 at the step SA1. At the following step SA2, the amount of discharged energy in terms of Wh is calculated in accordance with the expression $V*I*\Delta T/3600$. The result of the calculation is then subtracted from a residual capacity Y to give a new stored residual capacity Y. At the subsequent step SA3, the newly calculated residual capacity Y is converted into an output duty cycle D in terms of % which corresponds to the characteristic of the display unit M connected to the residual capacity meter 1. The conversion is based on a predetermined function f(Y). At the last step SA4, the output duty cycle D is used for driving a needle of the display unit M. The position of the deflected needle indicates a residual capacity of the battery to the driver of the electric car. It should be noted that the function f(Y) used for the conversion can be implemented as a table, the contents of which are stored in memory 7 in advance. As an alternative, the function f(Y) can also be implemented by a predetermined arithmetic processing to be executed as a program by the CPU 5.

Figure 3:
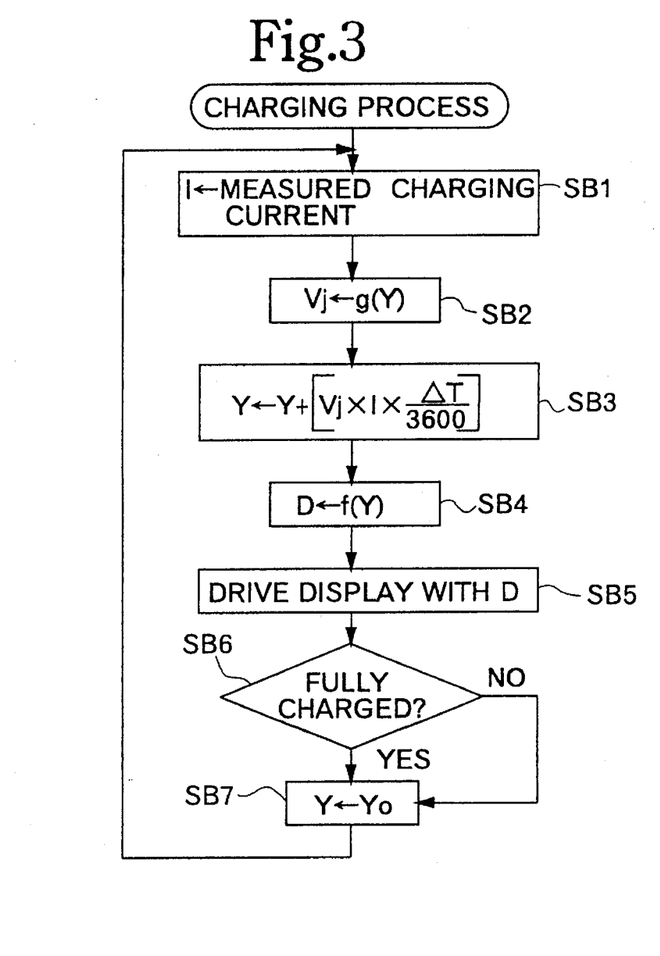
FIG. 3 illustrates a flowchart of a procedure to be followed by a CPU for carrying out arithmetic processings and operations during a charging process.

Next, the arithmetic processings and operations carried out during a charging process are explained by referring to the flowchart illustrated in FIG. 3. Much like the discharging process, the charging process comprises processing steps SB1 to SB7 which are executed repeatedly every $\Delta T$ seconds. First of all, the charging unit Ec is connected to the battery B, replacing the load L. As the charging is started, the data I representing the charge current Ic is supplied to the CPU at the step SB1. At the next step SB2, a predetermined function g(Y) is used for finding an estimated discharge voltage Vj from the current residual capacity of the battery B. The estimated discharge voltage Vj will be described later. At the following step SB3, the data I representing the charge current Ic and the estimated discharge voltage Vj are used for calculating the amount of stored energy in terms of Wh in accordance with the expression $Vj*I*\Delta T/3600$. The calculated amount of stored energy is then added to the capacity Y accumulated so far. The accumulated capacity Y updated in this way is stored in memory 7. At the subsequent step SB4, the new accumulated capacity Y is used to find an output duty cycle D (%) of the display unit M according to the function f(Y). At the next step SB5, the output duty cycle D drives the display unit M, deflecting its needle to a position indicating the capacity Y accumulated so far. The flow then continues to the step SB6 to determine whether or not the battery B has been fully charged. If the battery B is found not fully charged at the step SB6, the processings of the steps SB1 to SB5 are repeated. If the battery B is found fully charged at the step SB6, on the other hand, the flow goes to the step SB7 at which the accumulated capacity Y is stored as an initial battery residual capacity Yo at a predetermined location in the memory 7.

Figure 4:
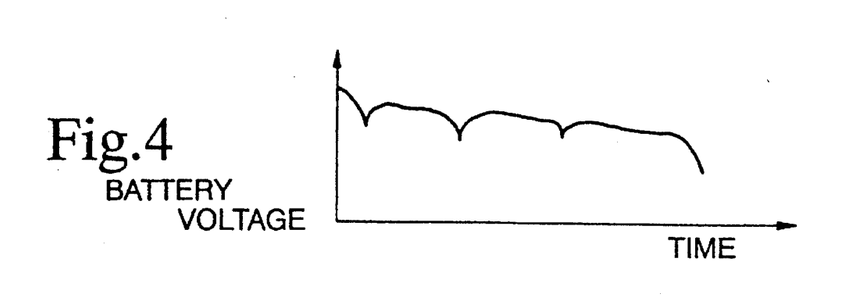
FIG. 4 illustrates a curve representing variations in battery discharge voltage of a running electric car over the lapse of time.
Figure 5:
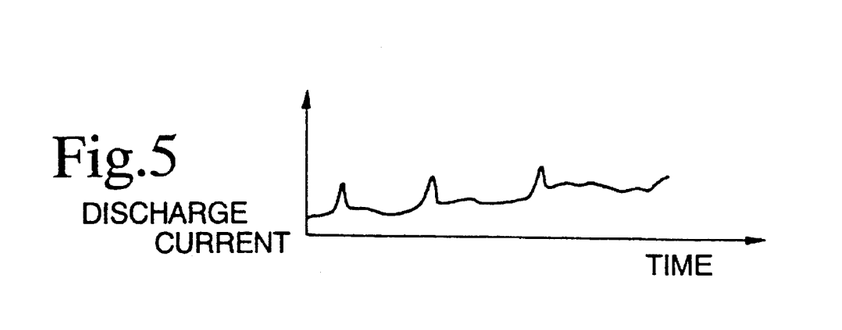
FIG. 5 illustrates a curve representing variations in battery discharge current of a running electric car over the lapse of time.

The following is description of the estimated discharge voltage Vj and the function g(Y) cited above. FIGS. 4 and 5 each illustrate typical changes in voltage and current respectively over the lapse of time. The changes occur while the electric car is running or while its battery is undergoing a discharging process. As shown in FIG. 4, the voltage of the battery exhibits a decreasing trend from an initial value at the start of the discharging process. On the other hand, the curve shown in FIG. 5 indicates that the discharge current exhibits an increasing trend as a result of the decreasing voltage in order to sustain a required torque of the motor. In addition, the discharge current also increases temporarily while the voltage drops accordingly during acceleration.

In general, a battery generates electrical energy through a chemical process and the amount of energy generated at one time cannot therefore be increased abruptly. When it is necessary to increase the torque of the motor temporarily during acceleration, the discharge current must also be increased temporarily for an almost constant terminal voltage of the battery B. As described above, however, the amount of generated energy can only be increased by a certain amount. Accordingly, when a large current flows during acceleration or the like, the voltage of the battery drops inevitably to limit the increase in consumed energy. When the electric car runs at almost the same pace from the beginning to the end, the battery voltage is prone to go lower as the residual capacity of the battery decreases. On the contrary, the discharge current shows an increasing trend. This is because the discharge current must be increased to compensate for the decrease in terminal voltage in order to produce the same amount of energy or to generate a constant power which is equal to the product of the discharge current and the terminal voltage.

Focusing on a relation between the running condition and the battery residual capacity of an electric car as described above, the present invention clarifies a correlation between the battery voltage and the battery residual capacity in a running mode of an electric car from results of a variety of test-working experiments. The clarification of such a correlation allows an estimated discharge voltage Vj corresponding to a battery residual capacity to be found. In each test-working experiment, the electric car undergoes a trial run under a condition determined in advance. During the test-working experiment, the battery voltage and current are measured from time to time and measurement results are stored as data. When the experiment is completed, each measured voltage is multiplied by its corresponding measured current to give a power value at a particular time. Such a power value is calculated for each point of measurement time. Since several experiments are carried out, a relation between predetermined power values (the values of the battery residual capacity) and average discharge voltages can be found. The transformation function g(Y) cited earlier is determined from information on the correlation between the values of the battery residual capacity and the average voltage. Typically, the transformation function g(Y) is implemented as data in a table format stored in the memory 7 in advance. In this case, the values of the battery residual capacity are associated typically with a memory address from which the value of a voltage corresponding to the particular residual capacity can be read out by the CPU 5. The value of the voltage is then output as an estimated discharge voltage.

As described above, a transformation function g(Y) is derived from results of a variety of test-working experiments. The transformation function g(Y) is, in turn, used for updating the battery residual capacity of an actually running electric car. In addition, another technique is also available for use by the user to find out the transformation function g(Y) under a condition determined almost in accordance with the user's desire. To be more specific, while the electric car is actually running, the relation between the battery residual capacity and the battery discharge voltage is identified gradually in a learning process and the transformation function g(Y) is properly modified according to results obtained during the learning process. In this case, a relation between the values of the battery residual capacity and the average voltage is found from values of the battery voltage and current actually measured by the residual capacity meter of a running electric car actually driven by the user (that is, with the battery being discharged) in accordance with the same procedure adopted in the test-working experiments described earlier. The relation found in this way is learned and stored. When the battery is charged later, arithmetic processings and operations are carried out in accordance with the flowchart shown in FIG. 3 wherein the transformation function g(Y) stored during the learning process is used for finding estimated discharge voltages Vj in the calculation of the battery residual capacity. In this way, values of the estimated discharge voltages can also be found under conditions in which the battery is actually used.

Figure 6:
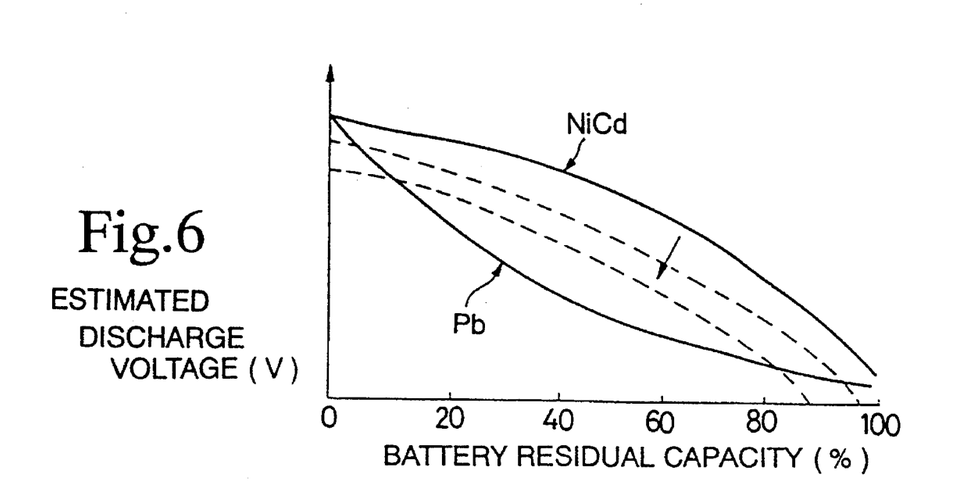
FIG. 6 illustrates curves representing relations between the residual capacity and the average voltage of a battery.

By the way, typical relations between actual values of the battery residual capacity and the estimated discharge voltage is shown in FIG. 6. The curves shown in FIG. 6 show data for an NiCd (Nickel-Cadmium) battery and a Pb (Lead) battery. Depending upon the conditions in which the batteries are used, the characteristic curves showing the relations between the average discharge voltage and the battery residual capacity are shifted either upward or downward, forming similar figures as shown by the dotted lines in FIG. 6.

Accordingly, by storing a condition under which the electric car is driven by the user obtained during the learning process instead of the relation itself, a characteristic can be selected among the similar figures automatically using the stored condition. As a result, average values of the battery voltage, that is, values of the estimated discharge voltage can be determined.

Figure 7:
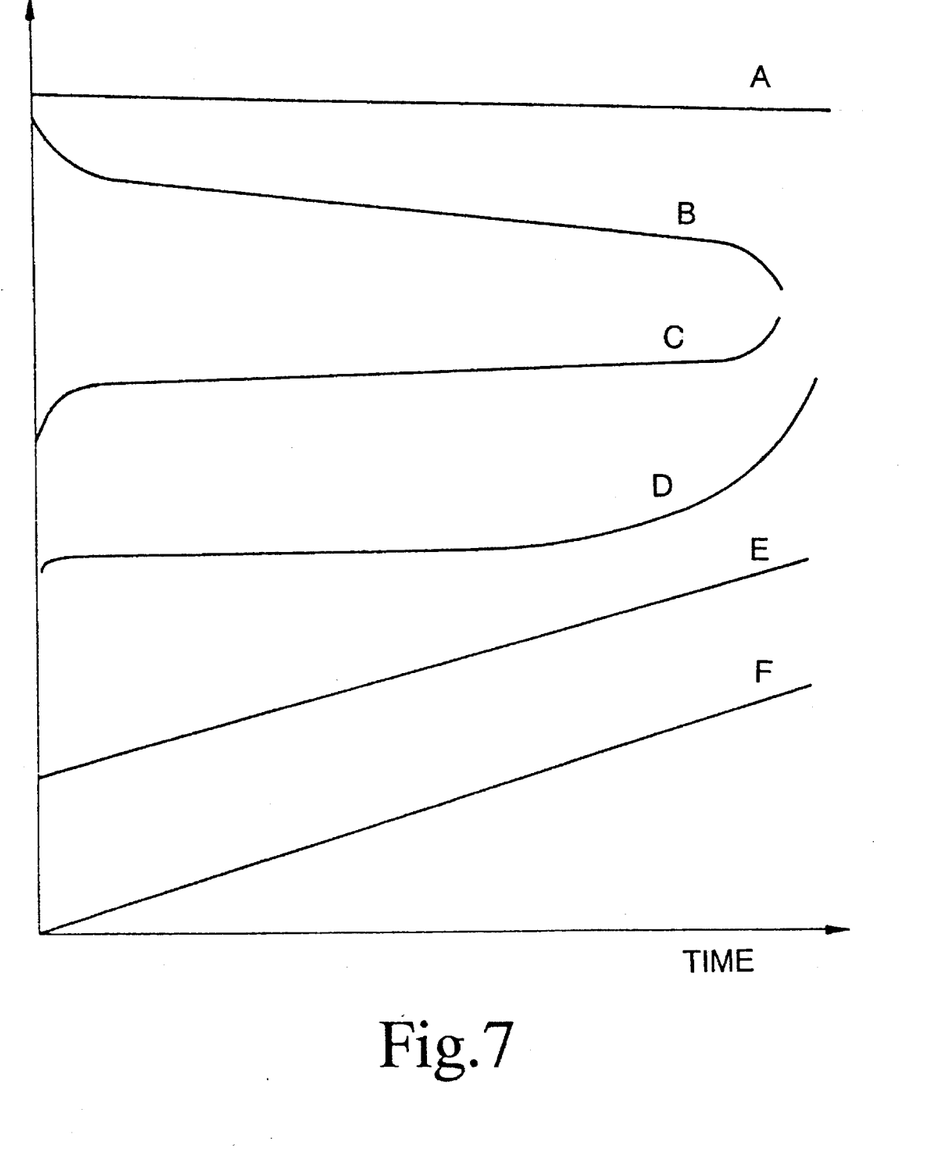
FIG. 7 illustrates a comparison of a travelable distance characteristic of an electric car with respect to electrical characteristics of a battery employed in the electric car.

The explanation given so far can be expressed by curves A to F shown in FIG. 7. The horizontal axis of FIG. 7 represents the lapse of time. The curve A indicates decreases in the amount of power that can be consumed from a battery by a fixed load. The curve B shows decreases in battery voltage. The curve C represents increases in current required for consuming a fixed energy out off the battery. The increases shown by the curve C compensate for the decreasing characteristic of the voltage indicated by the curve B. The curve D represents the amount of consumed charge expressed in terms of Ah whereas the curve E represents the amount of consumed energy expressed in terms of Wh. Finally, the curve F represents the distance traveled by the electric car. It is obvious from the curves D, E and F that, when comparing the amount of battery capacity consumption to the traveled distance, the curve E representing the amount of consumed energy expressed in terms of Wh matches the curve F much better than the curve D representing the amount of consumed charge expressed in terms of Ah. As a result, the curve E is a more effective indicator of the battery residual capacity than the curve D.

It should be noted, however, that implementations of the present invention are not limited to the configuration and operation of the preferred embodiment described above. The following modifications can also be implemented as well.

Firstly, as shown in FIG. 1, the mechanism of the residual capacity meter is implemented into a single unit configured separately from the battery and the charging unit. However, the residual capacity meter can also be embedded inside the charging unit. In this case, their circuits can be designed so that the electric charging control function of the charging unit and the function of the residual capacity meter can be executed at the same time.

Secondly, the explanation of a software portion allowing the CPU to switch from the flowchart for a discharging process shown in FIG. 2 to the flowchart of a charging process shown in FIG. 3 or vice versa is omitted. The switching of the CPU from the flowchart for a discharging process shown in FIG. 2 to the flowchart of a charging process shown in FIG. 3 or vice versa can, typically, be based on the sign of a detection value output by the current sensor. For example, a negative sign is considered to indicate a charging process while a positive sign is regarded as denoting a discharging process. As an alternative, the state of the main switch for turning on the engine of the electric car can be used as a criterion. To be more specific, the state of the main switch can be used for determining whether the electric car is running or its battery is undergoing a charging process.

Additionally, the description of the embodiment states that the residual capacity meter is also used for indicating the amount of accumulated energy during a charging process. In actuality, however, it may not be necessary to display such a quantity during the charging process. In this case, the operations to convert the amount of accumulated energy into an output duty cycle and to display the energy amount can thus be eliminated.

Also, a non-contact current sensor such as a sensor made of a Hall IC adopting a magnetic-flux detection principle can be employed. It should be noted, however, that types of transducers are not limited to such a sensor. For example, the conventional detection technique using a shunt resistor can also be embraced as well.

As described above, the present invention relates to a method and an apparatus for detecting a current residual capacity of a battery employed in an electric vehicle or car. As noted above, during a charging process, the method comprises measuring a value of the charge current of the battery; finding an estimated discharge voltage corresponding to a current battery accumulated power; computing a power as a product of the value of the charge current of the battery and the estimated discharge voltage; and adding the computed power to the current battery accumulated power to give a new current battery accumulated power for display. During a discharging process, on the other hand, the method comprises measuring values of the discharge voltage and the discharge current; computing the amount of consumed power as a product of the values of the discharge voltage and the discharge current; and subtracting the computed amount of consumed power from a current battery residual capacity to produce a new current battery residual capacity for display.

As a result, a battery residual capacity, which corresponds to a distance that the electric car can actually travel, can thereby be measured with a high degree of accuracy.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims. For instance, the present invention may be used in an electric vehicle and is not limited to use with an electric car.

What is claimed is:

1. A method of measuring a battery residual capacity of an electric vehicle battery during a charging process comprising the repeated steps of:

measuring a charge current of the battery;

estimating a discharge voltage corresponding to a current battery residual capacity;

computing a power of the battery as a product of the measured charge current of the battery and the estimated discharge voltage; and accumulatively adding the computed power to the current battery residual capacity to provide a new current battery residual capacity for display, the method of measuring a battery residual capacity during a discharging process comprising the repeated steps of measuring a discharge voltage and a discharge current of the battery;

computing a consumed power as a product of the measured discharge voltage and the measured discharge current; and subtracting the consumed power from a most recent battery residual capacity to produce a new most recent battery residual capacity for display.

2. The method of measuring a battery residual capacity of claim 1, wherein the new current battery residual capacity is stored as an initial battery residual capacity when the battery enters a fully charged state.

3. The method of measuring a battery residual capacity of claim 1, wherein data showing a correlation between average voltage values and battery residual capacity values measured in a variety of test-working experiments performed on the electric vehicle in an actual running state are stored in advance and the estimated discharge voltage corresponding to the current battery residual capacity is obtained as a corresponding average voltage value of the stored data.

4. The method of measuring a battery residual capacity of claim 1, wherein data showing a correlation between average voltage values and battery residual capacity values measured for the electric vehicle in an actual running state are gradually stored during a learning process and the estimated discharge voltage corresponding to the current battery residual capacity determined from the data stored during the learning process.

5. A battery residual capacity measuring apparatus for measuring a residual capacity of an electric vehicle battery comprising:

voltage measurement means for measuring a terminal voltage of the battery;

current measuring means for measuring a charge current and a discharge current of the battery; and control means, coupled to said voltage measurement means and said current measurement means, for repeatedly computing a consumed power as a product of the measured discharged current and the measured discharged voltage and subtracting the computed consumed power from a most recent battery residual capacity to produce a new most recent battery residual capacity during a discharging process, and repeatedly estimating a discharge voltage corresponding to a current battery residual capacity, computing a power as a product of the measured charge current of the battery and the estimated discharge voltage, and accumulating the computed power of the current battery residual capacity to produce a new current battery residual capacity during a charging process.

6. The battery residual capacity measuring apparatus of claim 5, wherein data showing a correlation between average voltage values and battery residual capacity values measured in a variety of test-working experiments performed on the electric vehicle in an actual running state are stored in memory means in advance and the estimated discharge voltage corresponding to the current battery residual capacity of the electric vehicle is obtained as a corresponding average voltage value of the stored data.

* * * * *

UNITED STATES PATENT AND TRADEMARK OFFICE
CERTIFICATE OF CORRECTION

PATENT NO.   : 5,479,085
DATED        : December 26, 1995
INVENTOR(S)  : Satoshi HONDA et al It is certified that error appears in the above-indentified patent and that said Letters Patent is hereby corrected as shown below:

On title page,

In Section [75] Inventors:

change "Nazazawa" to --Nakazawa--.

Signed and Sealed this

Twenty-fourth Day of February, 1998

Attest:

BRUCE LEHMAN

*Attesting Officer*      *Commissioner of Patents and Trademarks*